United States Patent [19]
Gillingham

[11] Patent Number: 5,532,955
[45] Date of Patent: Jul. 2, 1996

[54] METHOD OF MULTILEVEL DRAM SENSE AND RESTORE

[75] Inventor: Peter B. Gillingham, Kanata, Canada

[73] Assignee: Mosaid Technologies Incorporated, Kanata, Canada

[21] Appl. No.: 366,921

[22] Filed: Dec. 30, 1994

[51] Int. Cl.$^6$ ............................................ G11C 11/24
[52] U.S. Cl. ........................................ 365/149; 365/203
[58] Field of Search .................... 365/149, 189.01, 365/189.07, 210, 203, 102

[56] References Cited

U.S. PATENT DOCUMENTS

| | | | |
|---|---|---|---|
| 4,771,404 | 9/1988 | Mano et al. | 365/189.07 |
| 5,184,324 | 2/1993 | Ohta | 365/149 |
| 5,283,761 | 2/1994 | Gillingham | 365/149 |
| 5,293,563 | 3/1994 | Ohta | 365/149 |

OTHER PUBLICATIONS

Ohta, Yoshiji et al., Symposium, "A Novel Memory Cell Architecture for High–Density DRAMs," VLSI Circuits, May 1989, pp. 101–102.

Primary Examiner—Tan T. Nguyen
Attorney, Agent, or Firm—Hamilton, Brook, Smith & Reynolds

[57] ABSTRACT

A method of processing a data bit having one of four voltage levels stored in a dynamic random access memory (DRAM) cell capacitor comprised of sensing whether or not the data bit voltage is above or below a voltage level midway between a highest and a lowest level of the four levels, and indicating a sign bit based thereon, setting a threshold level based on the ratio of the capacitance of a storage cell capacitor and the total of the cell capacitor, a dummy cell capacitor and a bitline and the value of a sign bit, and sensing whether the data voltage is higher or lower than the threshold level, and indicating a magnitude bit based thereon, whereby the combination of the sign and magnitude bits represent which of the four levels is the voltage level data bit.

9 Claims, 7 Drawing Sheets

METHOD OF MULTILEVEL DRAM SENSE AND RESTORE

FIELD OF THE INVENTION

This invention relates to dynamic random access memories (DRAMs), and in particular to a method of storing a variable signal in each cell of a DRAM for representing more than one bit in each cell.

BACKGROUND TO THE INVENTION

In a DRAM multiple-bit-level storage design described in U.S. Pat. No. 5,283,761, invented by Peter Gillingham, memory cell charge is dumped onto a bitline to create a data voltage which is sensed as to whether it is above or below a voltage level midway between a highest and a lowest of four levels (providing the sign bit), and the voltage on a reference bitline is set to be higher than the lowest and lower than the next highest of the four levels in the event the data voltage is below the midway voltage level, and set to a voltage higher than the second highest and lower than the highest of the four levels in the event the data voltage is above the midway point. The data voltage is then sensed as to whether it is higher or lower in voltage than the reference bitline (providing the magnitude bit), whereby which of the four levels the data bit occupies is read.

That design is dependent on the reference value being set based on the conditional value of a magnitude bit. To restore the charge to the memory cell, either a full logic level is written to the cell, or an attenuated version thereof, depending on whether the data voltage was either the highest or lowest, or the second lowest or second highest values respectively. This required a circuit which attenuated a voltage conditionally based on the value of sensed data. Such a circuit is difficult to implement in the tight pitch of a DRAM sense amplifier.

The description of U.S. Pat. No. 5,283,761 is incorporated herein by reference.

SUMMARY OF THE INVENTION

In the present invention, in contrast to the design in the aforenoted patent, the voltage restored to the memory cell is created by unconditionally sharing the charge on three sub-bitline conductors. The full logic level representing the sign bit, either Vdd or Vss is applied to two of the sub-bitlines, and the full logic level representing the magnitude bit is applied to a third sub-bitline. Then the charge on the three sub-bitlines is shared and the resulting level stored in the cell. In the case where both sign and magnitude had the same value of Vdd or Vss, the full Vdd or Vss value would be restored to the cell.

If the sign and magnitude bits had opposite values, either 2Vdd/3 or Vdd/3 is restored to the cell, depending on whether the sign was Vdd and magnitude Vss, or the sign was Vss and magnitude Vdd respectively. In this way no conditional operation is needed and the circuit can be implemented efficiently.

In accordance with an embodiment of the invention, a method of processing a data bit having one of four voltage levels stored in a dynamic random access memory (DRAM) cell capacitor is comprised of sharing cell charge on two sub-bitlines and sensing whether or not a resulting data bit voltage is above or below a voltage level midway between a highest and a lowest level of the four levels, and indicating a sign bit based thereon, setting a threshold level based on the value of the sign bit and the ratio of the capacitance of a storage cell capacitor and the total of the cell capacitor, a dummy cell capacitor and three sub-bitline capacitance, sensing whether the data bit voltage is above or below the threshold level and indicating a magnitude bit bused thereon, whereby the combination of the sign and magnitude bits represent which of the four levels is the voltage level data bit, and restoring data to the memory cell by charging two sub-bitlines to the full logic level represented by the sign bit, and one sub-bitline to the full logic level represented by the magnitude bit, and charge sharing the three sub-bitlines whereby one of four levels is restored to the memory cell.

BRIEF INTRODUCTION TO THE DRAWINGS

A better understanding of the invention will be obtained by reading the description of the invention below, with reference to the following drawings, in which:

FIGS. 1–10 are schematic diagrams illustrating a DRAM bitline and ancillary circuitry, in sequential operational steps, FIG. 11 is a timing diagram of signals in the circuitry of FIGS. 1–9, FIG. 12 is a schematic diagram of a sense amplifier, and FIG. 13 is a chart illustrating voltage levels referred to in the disclosure.

DETAILED DESCRIPTION OF THE INVENTION

With reference to FIGS. 1–9, a folded bitline is illustrated, which is comprised of sub-bitline pairs BL, BL*, and BR, BR*, connected via the source drain circuits of FETs 1 and 3. The gate of FET 1 is enabled by a logic signal C, and the gate of FET 3 is enabled by a logic signal C*, both of which can be either Vdd or Vpp (at least Vdd +Vtn, where Vtn is the threshold voltage of operation of an FET) level logic signals.

It should be noted below, that a convention will be used below in identifying signals and elements, wherein L in the identifier designates a signal or element to the left side of FET C or C*, and R in the identifier designates a signal or element to the right of FET C or C*.

An FET 5 has its source-drain circuit connected between BL and BL*, and an FET 7 has its source-drain circuit connected between BR and BR*. When enabled by respective signals EL and ER, FETs 5 and 7 short circuit the corresponding left and right conductor pairs.

A cell capacitor 9 is connected via the source-drain circuit of an FET 11 to BL* and a dummy capacitor 13 is connected via the source-drain circuit of an FET 15 to BR*. The gate of FET 11 is connected to a word line WLi and the gate of FET 15 is connected to a row line DRo. A signal WLi on the word line of the same name enables FET 9, thus allowing charge from BL* to be stored in capacitor 9 or charge stored in capacitor 9 to be dumped to BL*. Similarly A signal DRo on the word line of the same name enables FET 15, thus allowing charge from BR* to be stored in capacitor 13 or charge stored in capacitor 13 to be dumped to BR,.

Figure 12:
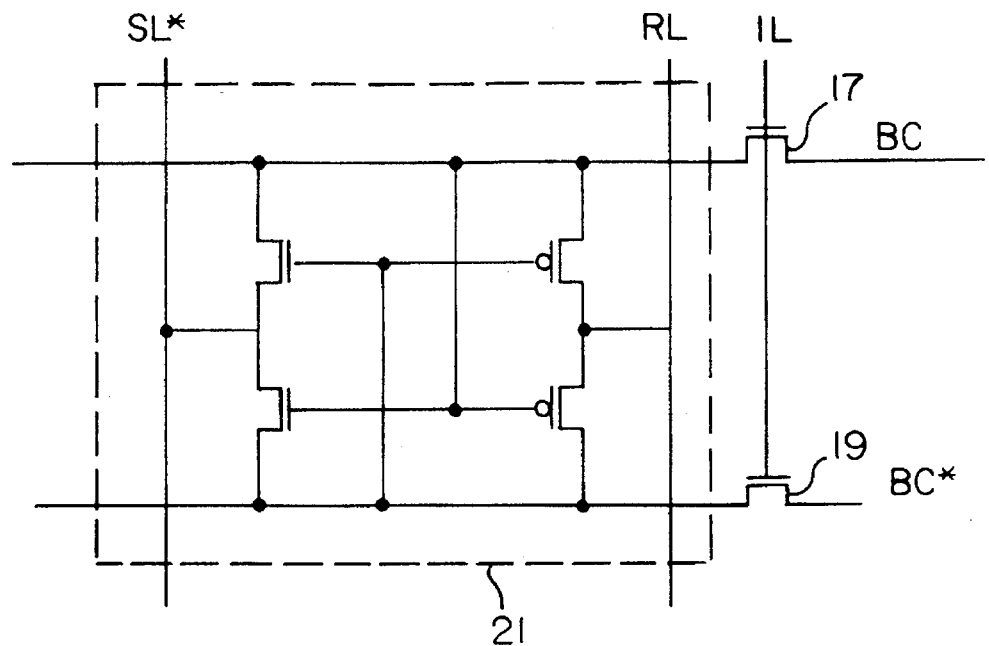

The source-drain circuits of a pair of FETs 17 and 19 couple BL and BL* to a left sense amplifier 21 such as shown in FIG. 12, and the source-drain circuits of a pair of FETs 23 and 25 couple BR and BR* to a right sense amplifier 27 corresponding to the one shown in FIG. 12. The gates of FETs 17 and 19 are driven by an IL signal, and the gates of FETs 23 and 25 are driven by an IR signal. The source-drain circuits of a pair of FETs 29 and 31 are connected in series between BL* and BL, and their junction to a source of precharge voltage Vdd/2. The source-drain circuits of a pair of FETs 33 and 35 are connected in series between BR* and BR, and their junction to a source of precharge voltage Vdd/2. The gate of FET 29 is driven by a PLo signal, the gate of FET 31 is driven by an PLe signal, the gate of FET 33 is driven by a PRe signal and the gate of FET 35 is driven by a PRo signal.

The source-drain circuit of an FET 37 is connected between BL* an BR, and the source-drain circuit of an FET 39 is connected between BL and BR*. The gate of FET 37 is driven by an X* signal and the gate of FET 39 is driven by an X signal.

While the above-described circuit is used in the description of the invention below, other circuitry connected to the various folded bitline conductors may be used, as shown in the figure. However, as they do not take part in the particular description of how the value of a bit which may take one of four values is sensed, they will not be referred to. The structure of a folded bitline, ancillary circuitry and circuitry connected to other conductors of the bitline will be understood by a person skilled in the art, and a discussion of that extra circuitry is believed to be redundant. It is also understood that a person skilled in the art understands the manner of operation of the invention described in U.S. Pat. No. 5,283,761 which is incorporated herein by reference.

A convention will also be used in this specification, wherein when an element or voltage is described to be high, this means that high logic level is applied. High logic level is considered to be Vdd, unless otherwise noted. When an element or voltage is described to be low, this means that low logic level is applied. Low logic level is considered to be 0 or Vss, unless otherwise noted.

Figure 8:
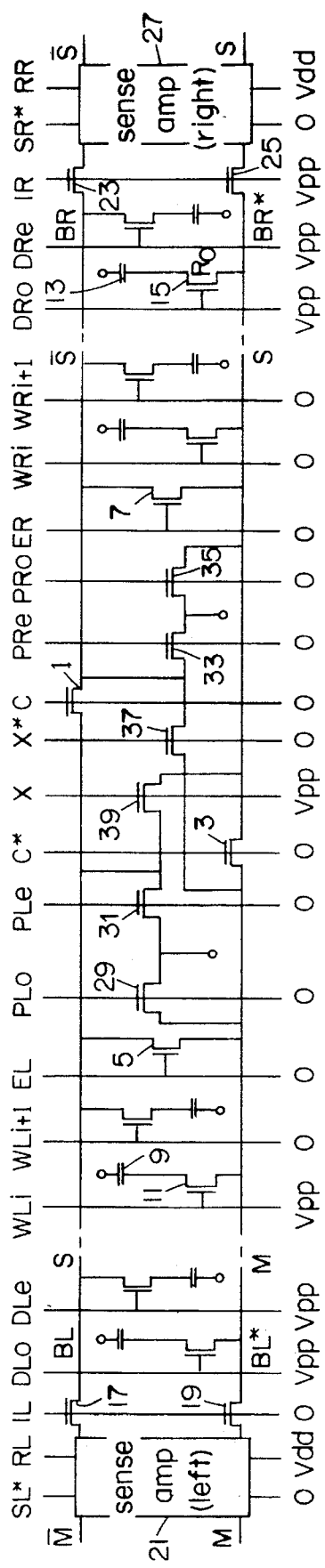
Figure 9:
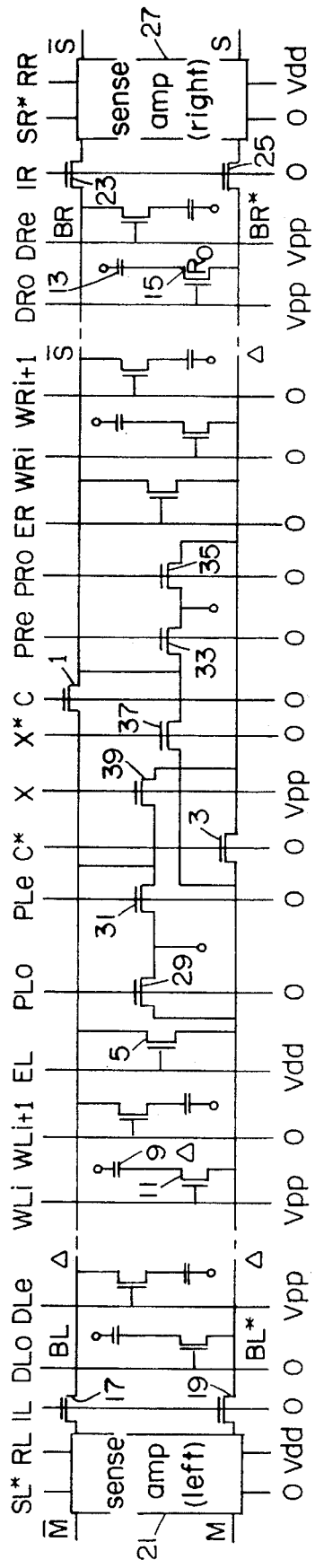
Figure 10:
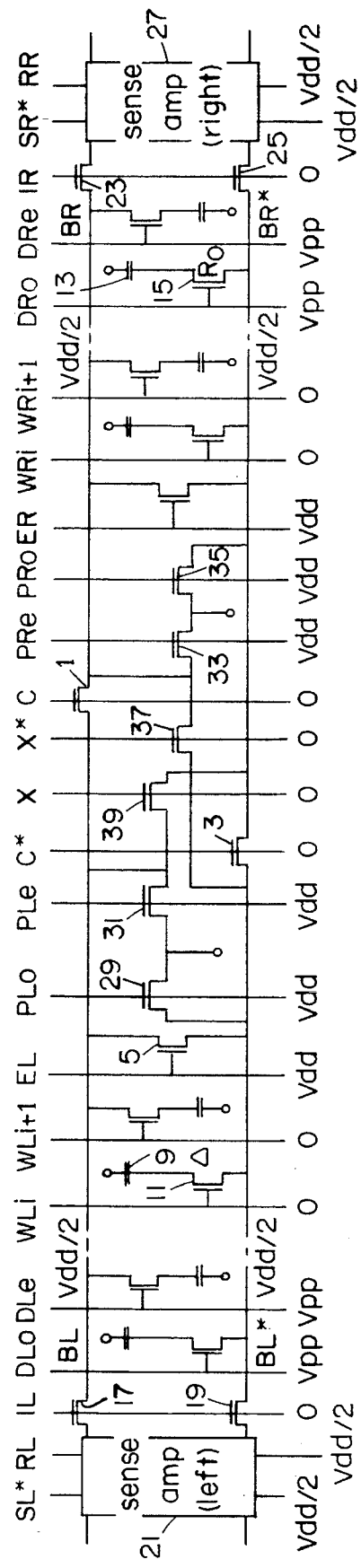
Figure 11:
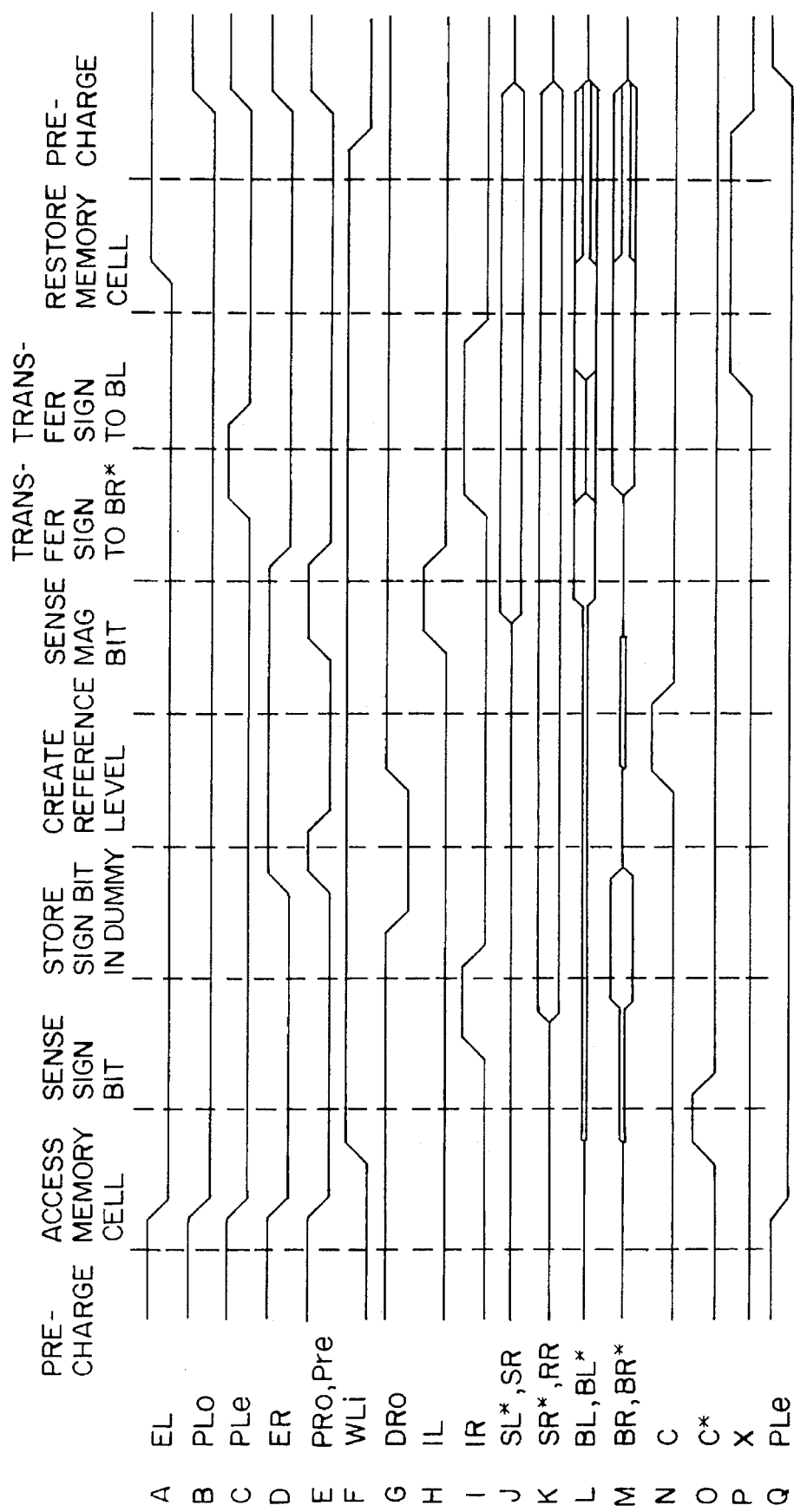

A description of operation of the present invention will follow, with reference to each of FIGS. 1–9, but all in conjunction with FIGS. 10 and 11. Each labelled vertical segment of FIG. 10 is a stage corresponding to one of FIGS. 1–9.

Figure 1:
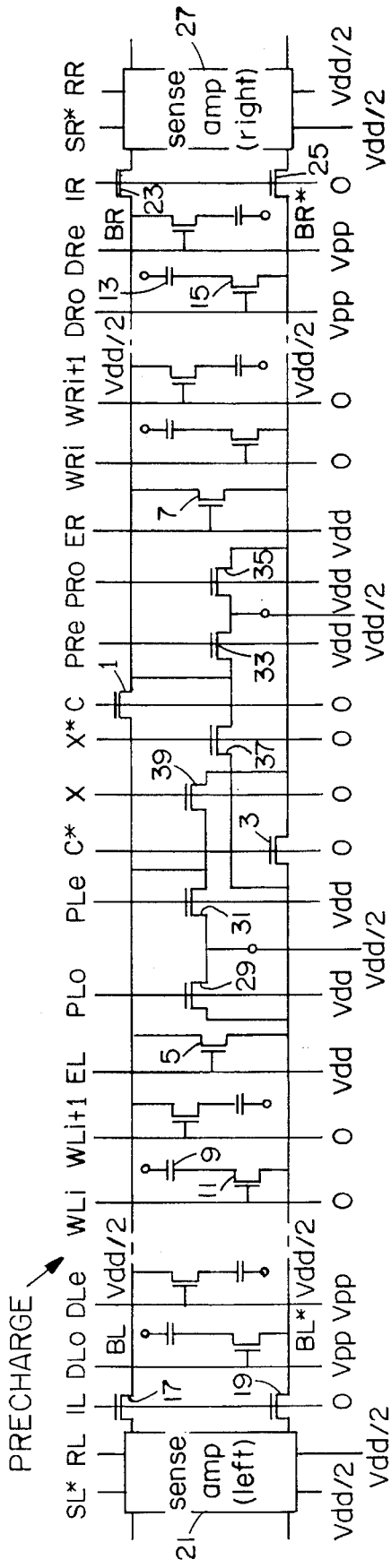

FIG. 1 illustrates a first stage in a reading cycle, a precharge stage. In this case DLo, DLe, DRo, Dre, EL, PLo, PLe, PRe, PRo and ER are the only inputs that are high, the others shown in FIG. 10 being low. Dummy word lines DLo, DLe, DRo and DRe have the value Vpp when high. As a result, each of the conductor pairs BL and BL* and BR and BR* is isolated from the other pair, the conductor pairs BL and BL* are connected together through FET 5, and conductor pairs BR and BR* are connected together through FET 7. Precharge voltage is applied through FETs 29 and 31 to BL* and BL, and precharge voltage is applied through FETs 33 and 35 to BR and BR*.

As a result, BL, BL*, BR and BR* and the dummy cell capacitors become precharged to voltage Vdd/2.

Figure 2:
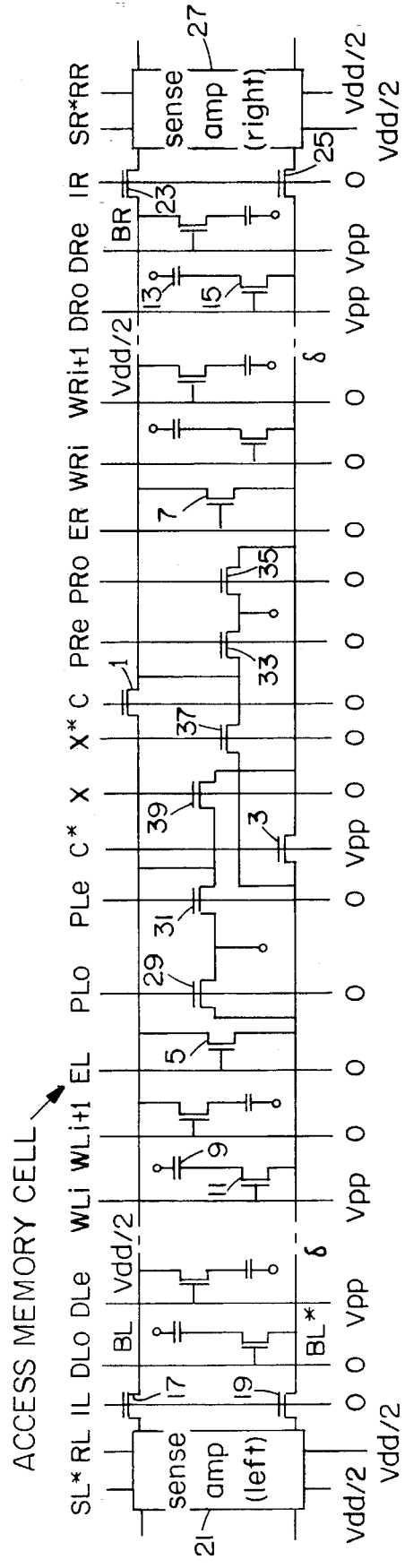

In the second stage, shown in FIG. 2, the DLo, EL, PLo, PLe, PRe, PRo and ER inputs that were high, go low, and following, WLi and C* go high (to Vpp voltage) while DLe, DRe and DRo remain high. As a result, BL* and BR* are connected together, the dummy capacitor 13 is connected to BR* through FET 15, and capacitor 9 dumps its charge on BL*. The charge dumped on BL* passes to dummy capacitor 13, where it is shared. The resulting voltage on BL* and BR* is (Δ−Vdd/2)Ccell/(Ccell+Cbl)+Vdd/2, where Ccell is the capacitance of the charge storage capacitor 9, Δ is the initial voltage on capacitor 9, and Cbl is the capacitance of the bitline conductors BL* and BR* plus the capacitance of the dummy capacitor 13. The voltage on BL and BR is Vdd/2.

Figure 3:
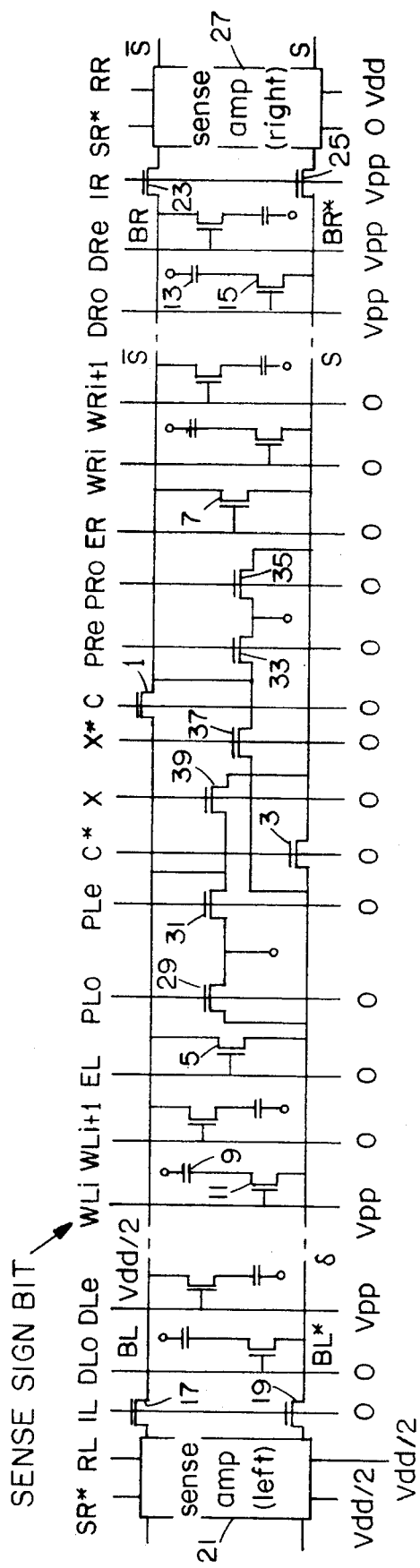

In the next stage, shown in FIG. 3, Wli and DRo are still high, and thus capacitors 9 and 13 are still coupled to BL* and BR*. However, C* has gone low. Now IR goes high (to Vpp), and SR* is forced to Vss and RR is forced to Vdd to allow the right sense amplifier to sense BR*, i.e. whether it is higher or lower than Vdd/2 which is carried by BR. As a result, the BR and BR* conductors are brought to full logic level /S and S, with polarity on BR and BR* depending on whether the voltage on BR was higher or lower than Vdd/2. This logic level is indicative of the sign of the bit originally stored by capacitor 9, and appears on the outputs SR* and RR of the right sense amplifier 27.

Figure 13:
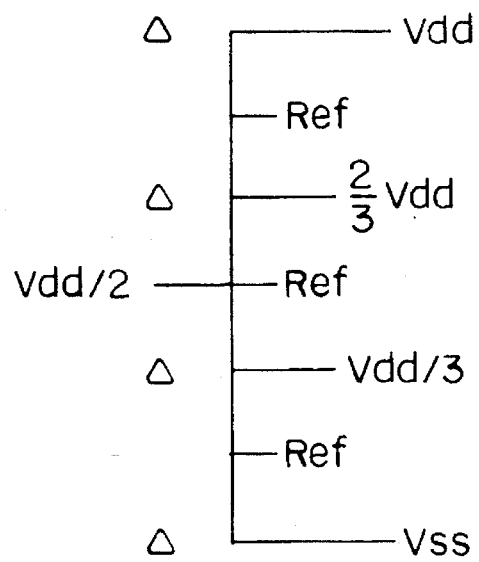

A truth table follows, which is illustrative of the logic level values of the sign and magnitude bits to be indicated by the sense amplifiers (see also FIG. 13).

| Δ | S | M |
|---|---|---|
| Vdd | 1 | 1 |
| 2Vdd/3 | 1 | 0 |
| Vdd/3 | 0 | 1 |
| 0 | 0 | 0 |

Thus the sign of the original bit is manifested by the full logic levels /S and S appearing on the BR and BR* conductors.

With the DRo signal high, the value of the logic level on the BR* conductor is stored in the dummy capacitor 13, through FET 15. The sense amplifier 27 maintains the sign bit sense logic levels on its output leads SR* and SR.

Figure 4:
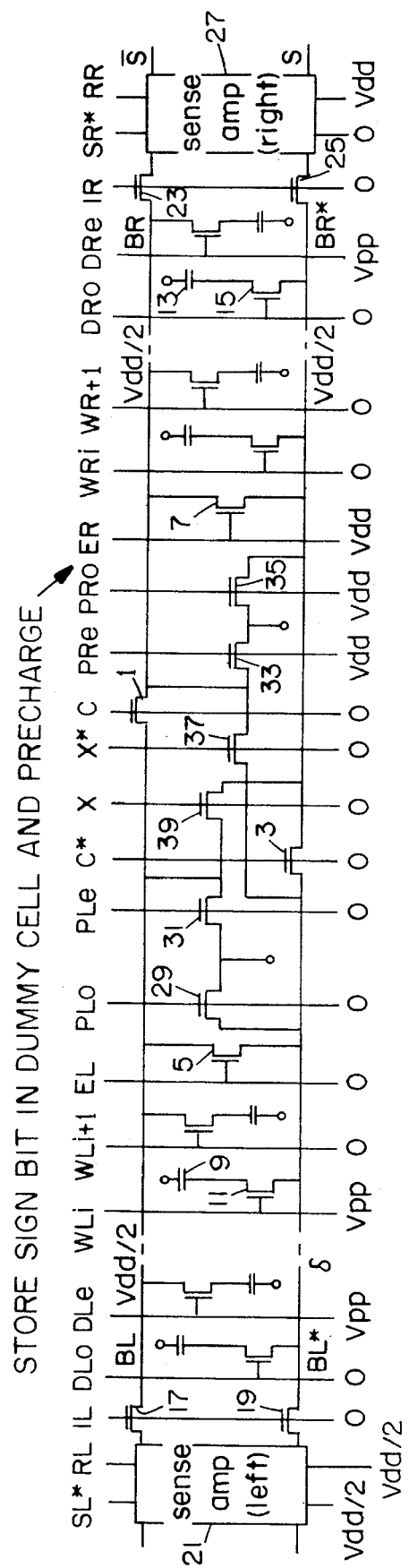

FIG. 4 illustrates the next stage in the cycle, in which the DRo and IR signals go low, and the ER, PRo and PRe signals go high. As a result, BR and BR* are connected together through FET 7, and a precharge voltage Vdd/2 is applied to BR and BR*. Each of the conductors BL BR and BR* now carry the precharge voltage Vdd/2. The value of the sign bit is stored in dummy capacitor 13.

Figure 5:
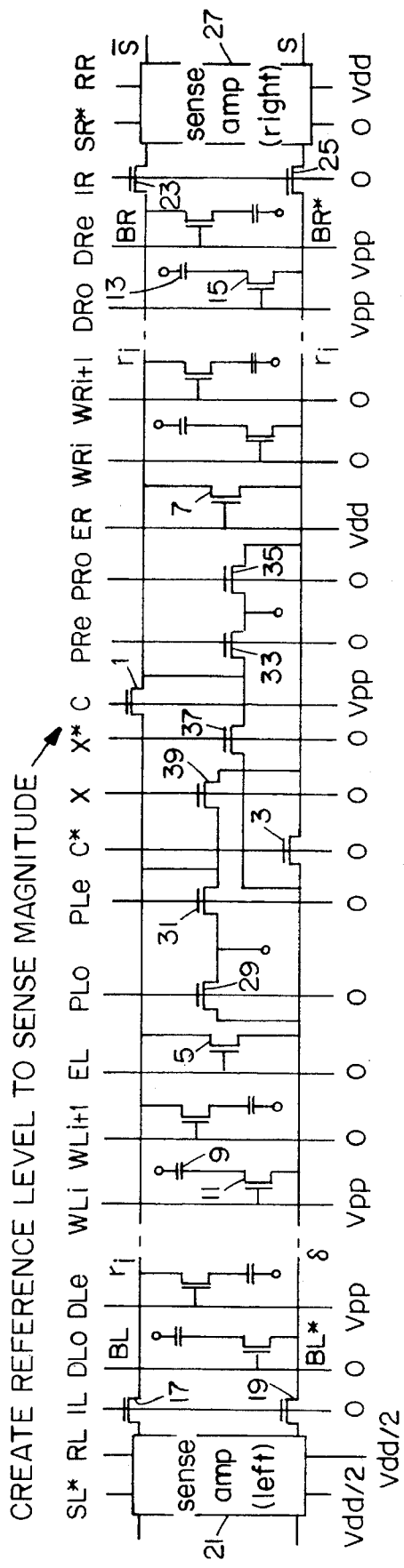

The next stage is illustrated in FIG. 5. The signal C goes high, to Vpp or Vdd, causing the BL and BR leads to be connected together through FET 1. The Pre and PRo signals go low, disconnecting Vdd/2. The ER signal remains high, causing BR and BR* to be connected together through FET 7. Thus all of BL BR and BR* are connected together. DRo then goes high, to Vpp, causing dummy capacitor 13 to dump its charge on BR*, which is shared to BL BR and BR*, resulting in a shared voltage ri thereon. The shared voltage ri=(Ri−Vdd/2) (Ccell/Ccell+Cbl)+Vdd/2. This voltage is the reference level against which the magnitude of the voltage on BL* will be measured in the following stage. Ri representing the equivalent cell-reference voltage, will be 5Vdd/6 for sign bit=1, and Vdd/6 for sign bit=0.

Figure 6:
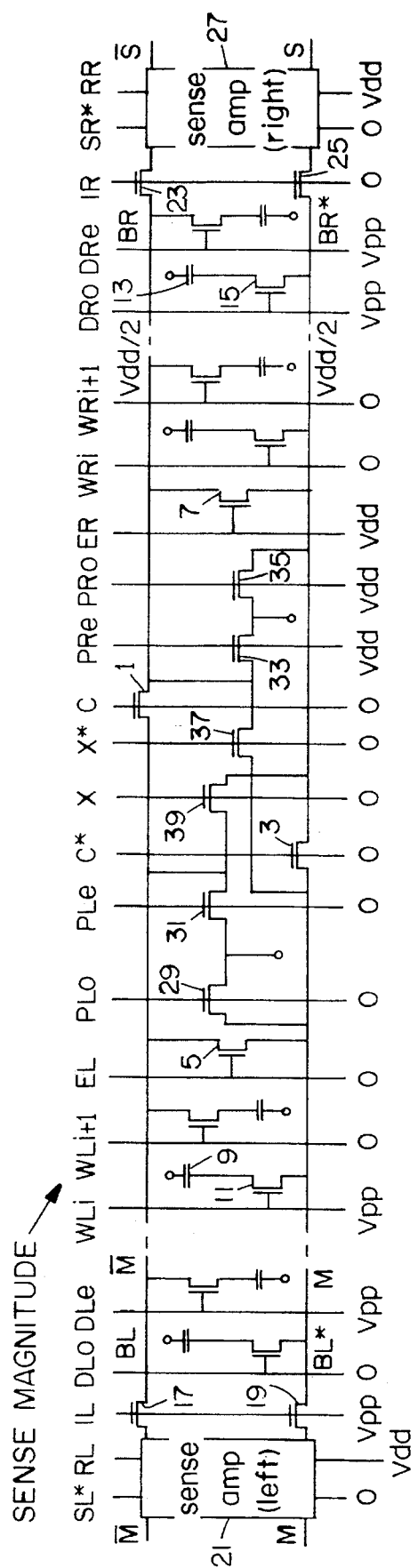
Figure 7:
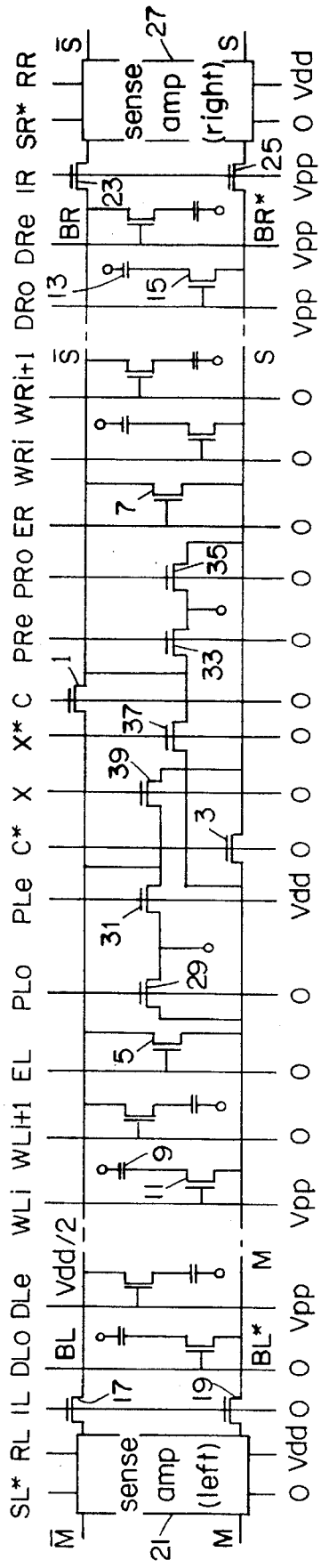

The next stage is illustrated in FIG. 6. The signal C has gone low, disabling FET 1 and thus disconnecting BL and BR from each other. PRe, PRo and ER go high, and DRo remains high, at Vpp. Thus, in a manner as described earlier, Vdd/2 precharge voltage is applied to BR BR* and the dummy capacitor 13.

IL goes high, to Vpp, thus connecting BL and BL* to the left sense amplifier 21. SL* and RL are asserted to enable sense amplifier 21 to sense the voltage value on BL* against the ri voltage on BL, and applies full logic level /M and M to the bitline conductors BL and BL*. This polarity of this logic level is indicative of the magnitude of the bit voltage level originally stored in capacitor 9.

Thus the circuit has obtained the sign and magnitude of the bit value of the possible four voltage levels originally stored in capacitor 9, and has provided the bit values at the outputs of sense amplifiers 27 and 21, as indicated in the table noted above.

At this point, the BL and BL* conductors carry full logic levels /M and M, and BR and BR* have been precharged to Vdd/2. The dummy capacitor, being connected to BR*, is charged to the precharge voltage Vdd/2.

ER then goes low, unshorting BR and BR*. PRo and PRe go low, disconnecting the precharge voltage supply from BR and BR*. IL goes low, disconnecting BL and BL* from sense amplifier 21. PLe goes high, raising or dropping BL to Vdd/2 via FET 31. BL* is still at the previous sensed logic level. IR goes high, connecting BR and BR* to the sense amplifier 27. BR and BR*, sensed, go to logic level 0, 1 (0, Vdd).

In the next stage, as shown in FIG. 8, PLe goes low, disconnecting Vdd/2 from BL. X goes high, cross-connecting BL to BR*. Thus the voltage that was on BR* is transferred to BL i.e. the full logic level sign bit 0 or 1. Thus the sign bit has been transferred to BL. IR goes low to disconnect the sense amplifier from bitlines BR, BR*.

In FIG. 9, EL goes high, causing connection of BL and BL* together. With X being high, BR* is connected to BL. Therefore BR*, BL and BL* share charge. The sign magnitude /S remains on BR. WLi, which has remained high, connects the charge storage cell capacitor to BL*, and the shared charge, which is the value of Δ as indicated in the table, is stored in capacitor 9. The memory cell has thus been restored.

In a last stage, which places the circuit in the same state as the first stage, WLi goes low, and the DLo, PLo, PLe, ER, PRo and PRe signals go high. BR and BR* are connected together and to Vdd/2, and BL and BL* are connected together and to Vdd/2. Capacitor 9 is isolated from BL*, and the sense amplifiers are isolated from BR, BR*, BL and BL*. The bitline conductors are thus precharged to Vdd/2.

It should be noted that while storage sensing and restoration of data stored in a particular cell capacitor has been described, data stored in any DRAM charge storage capacitor may similarly be sensed and restored.

It may be seen that in the present invention, the sign and magnitude bits are generated in a positive and unconditional manner. The sign bit and the magnitude bit are first sensed in successive sensing operations. The data, represented by two digital bits, is then restored to the memory cell as one of four levels.

In summary, a reference level for sensing has been created by dumping the charge from a cell containing the sign bit to three sub-bitlines, which is equivalent to dumping a stored voltage Vdd/6 or 5 Vdd/6 reference level onto two sub-bitlines.

This may be realized by the voltage values for the reference levels being:

$$\text{let } C_b = C_{sub\text{-}bitline} + C_{cell}$$

$$\left( Vdd - \frac{Vdd}{2} \right) \frac{Cs}{3Cb} + \frac{Vdd}{2} = \left( \frac{5Vdd}{6} - \frac{Vdd}{2} \right) \frac{Cs}{2Cb} + \frac{Vdd}{2}$$

or $$\left( -\frac{Vdd}{2} \right) \frac{Cs}{3Cb} + \frac{Vdd}{2} = \left( \frac{Vdd}{6} - \frac{Vdd}{2} \right) \frac{Cs}{2Cb} + \frac{Vdd}{2}$$

A person understanding this invention may now conceive of alternative structures and embodiments or variations of the above. All of those which fall within the scope of the claims appended hereto are considered to be part of the present invention.

I claim:

1. A method of processing a data bit having one of four voltage levels stored in a dynamic random access memory (DRAM) cell capacitor comprising:

(a) sensing whether or not the data bit voltage is above or below a voltage level midway between a highest and a lowest level of said four levels, and indicating a sign bit based thereon, (b) setting a threshold level based on the ratio of the capacitance of a storage cell capacitor to the total capacitance of three cell capacitors and three sub-bitlines and the value of a sign bit, and (c) sensing whether the data bit voltage is higher or lower than the threshold level, and indicating a magnitude bit based thereon, whereby the combination of the sign and magnitude bits represent which of the four levels is the voltage level data bit.

2. A method as defined in claim 1 in which the data bit voltage is created by dumping the charge in a memory cell onto two sub-bitlines, and the threshold level is created by dumping the charge in a dummy cell representing the sign bit onto three sub-bitlines.

3. A method as defined in claim 2 in which the data voltage has four possible values, representing two data bits, represented as voltages Vdd, 2 Vdd/3, Vdd/3 and Vss(o) stored in the memory cell.

4. A method of processing a data bit having one of plural charge levels stored in a DRAM cell capacitor comprising:

(a) splitting a folded bitline into pairs of sub-bitlines each being comprised of a pair of conductors, to form one conductor pair BL and BL* and a second conductor pair BR and BR*, (b) precharging each of the conductors and a dummy cell capacitor to a precharge voltage, (c) connecting said cell capacitor to one of the conductors BL* of one of the bitline pairs, (d) connecting said conductor BL* to said conductor BR*, whereby charge stored on the cell capacitor is shared with both conductors and the dummy capacitor, (e) disconnecting the conductors BL* and BR* from each other and sensing the second conductor pair BR and BR*, whereby full logic level voltage is applied across the BR and BR* conductors with a polarity depending on whether a voltage resulting from the shared charge is higher or lower than the precharge voltage, the polarity designating a sign bit, (f) storing the full logic level voltage as determined by the sign bit from the BR* conductor, on the dummy capacitor, (g) connecting all of the conductors BL, BR and BR* together and precharging them while maintaining said full logic level voltage designating a sign bit on the dummy capacitor, (h) connecting the dummy capacitor to the connected BL, BR and BR* conductors, thus raising or lowering the voltage thereon above or below the precharge voltage, to provide a reference level $r_i$, (i) disconnecting the conductor BL from the conductor pair BR and BR*, (j) sensing the one conductor pair BL and BL* to determine whether a voltage from the cell capacitor on the BL* conductor is higher or lower than the reference voltage level ri on the BL conductor, and applying full logic level, M, $\overline{M}$ across the conductors BL and BL* with a polarity depending on which of the conductors BL or BL* carries a higher voltage than the other, the polarity designating a magnitude bit, whereby the sign and magnitude bits are indicative of one of four logic states corresponding to one of said plural levels stored in the DRAM cell capacitor.

5. A method as defined in claim 4, including the further steps of:

(k) re-applying full logic levels S and/S to conductors BR* and BR, (l) precharging conductor BL to a precharge voltage while maintaining the full logic level M on conductor BL*, (m) connecting conductors BR* and BL and charging both conductors BR* and BL to a full logic level S, and (n) short circuiting the conductors BL, BL* and BR* together with the cell capacitor whereby a charge corresponding to the initial data bit is stored on the cell capacitor.

6. A method of processing two bits of binary data in a DRAM in which each bitline is divided into two subbitlines comprising:

(a) charging two sub-bitlines to a full logic level representing one of the bits, (b) charging one other sub-bitline to a full logic level representing the other bit, (c) charge sharing the three sub-bitlines to one of four voltage levels and storing a result in a memory cell on one subbitline whereby two bits of data are stored in a single DRAM cell.

7. A method of restoring a DRAM charge storage cell on one of two bitlines, each bitline divided into two subbitlines, by charge sharing two sub-bitlines with a sign bit and a single sub-bitline with a magnitude bit, to obtain reference levels against which a cell voltage magnitude is sensed, wherein the sign bit S and magnitude bit M define reference levels in accordance with the truth table:

| S | M | 2S+M |
|---|---|------|
| 1 | 1 | (2Vdd+Vdd)/3 = Vdd |
| 1 | 0 | (2Vdd+0)/3 = 2Vdd/3 |
| 0 | 1 | (0+Vdd)/3 = Vdd/3 |
| 0 | 0 | (0+0)/3 = 0 |

8. A method of processing a data bit having one of plural charge levels stored in a DRAM storage cell capacitor comprising:

(a) splitting a folded bitline into pairs of sub-bitlines each being comprised of a pair of conductors, to form one conductor pair and a second conductor pair, (b) precharging each of the conductors and a dummy cell capacitor to a precharge voltage, (c) connecting said storage cell capacitor to one of the conductors of one of the bitline pairs with the dummy cell capacitor disconnected therefrom, (d) connecting said conductor connected to the cell capacitor to another conductor, whereby charge stored on the storage cell capacitor is shared with both conductors and a dummy cell capacitor, (e) disconnecting the conductors of step (d) from each other and sensing one of the conductors of step (d), whereby full logic level voltage is applied across a pair of conductors with a polarity depending on whether a voltage resulting from the shared charge is higher or lower than the precharge voltage, the polarity designating a sign bit, (f) storing the full logic level voltage as determined by the sign bit on a cell capacitor, (g) precharging three conductors while maintaining said full logic level voltage designating a sign bit on the cell capacitor of step (f), (h) connecting the cell capacitor of step (f) to the three precharged conductors with cell capacitors, thus raising or lowering the voltage thereon above or below the precharge voltage, to provide a reference level $r_i$, (i) disconnecting one of the three conductors, (j) sensing said one of the three conductors of step (i) to determine whether a voltage from the storage cell capacitor on another conductor is higher or lower than the reference voltage level on said one of the three conductors, and applying full logic level across the conductors with a polarity depending on which of the conductors carries a higher voltage than the other, the polarity designating a magnitude bit, wherein the sign and magnitude bits are indicative of one of four logic states corresponding to one of said plural levels stored in the DRAM cell capacitor.

9. A method as defined in claim 8, including the further steps of:

(k) re-applying a full sign bit logic level to a first conductor, (l) precharging a second conductor to a precharge voltage while maintaining the full magnitude logic level on a third conductor, (m) connecting the first and second conductors and charging both conductors to a full sign bit logic level, and (n) short circuiting the first, second and third conductors together with the storage cell capacitor whereby a charge corresponding to the initial data bit is stored on the storage cell capacitor.

* * * * *